US008847668B2

(12) United States Patent
Chen

(10) Patent No.: US 8,847,668 B2
(45) Date of Patent: Sep. 30, 2014

(54) CAPACITANCE COMPENSATION CIRCUIT OF A RADIO FREQUENCY SWITCH

(71) Applicant: RichWave Technology Corp., Taipei (TW)

(72) Inventor: Chih-Sheng Chen, Taipei (TW)

(73) Assignee: RichWave Technology Corp., NeiHu District, Taipei (TW)

( * ) Notice: Subject to any disclaimer, the term of this patent is extended or adjusted under 35 U.S.C. 154(b) by 0 days.

(21) Appl. No.: 13/784,835

(22) Filed: Mar. 5, 2013

(65) Prior Publication Data

US 2013/0321061 A1 Dec. 5, 2013

(30) Foreign Application Priority Data

May 31, 2012 (TW) .............................. 101119505 A

(51) Int. Cl.
*H03K 17/687* (2006.01)

(52) U.S. Cl.
USPC ............ 327/434; 327/436; 327/437; 333/103

(58) Field of Classification Search
USPC ................... 327/434, 436–437; 333/101–103
See application file for complete search history.

(56) References Cited

U.S. PATENT DOCUMENTS

| 5,563,545 | A  | * | 10/1996 | Scheinberg ................... 327/389 |
| 7,944,268 | B2 | * | 5/2011  | Okanobu ....................... 327/434 |
| 8,149,042 | B2 | * | 4/2012  | Nakahara et al. ............. 327/308 |
| 8,441,304 | B2 | * | 5/2013  | Kinoshita et al. ............. 327/427 |

\* cited by examiner

*Primary Examiner* — Kenneth B. Wells
(74) *Attorney, Agent, or Firm* — Winston Hsu; Scott Margo

(57) ABSTRACT

An RF switch includes a transistor and a compensation capacitor circuit. The compensation capacitor circuit includes a first compensation capacitor and a second compensation capacitor of the same capacitance. The compensation capacitor circuit is used to improve voltage distribution between a control node and a first node of the transistor and between the control node and a second node of the transistor.

23 Claims, 11 Drawing Sheets

CAPACITANCE COMPENSATION CIRCUIT OF A RADIO FREQUENCY SWITCH

BACKGROUND OF THE INVENTION

1. Field of the Invention

The present invention is related to a capacitance compensation circuit of an RF (radio frequency) switch, and more particularly, to a capacitance compensation circuit which improves voltage distribution of the RF switch.

2. Description of the Prior Art

Please refer to FIG. 1 and FIG. 2. FIG. 1 is a diagram illustrating a prior art RF switch 100. The RF switch 100 includes a transistor 102 having a first parasitic capacitor Cgd coupled between a gate and a drain of the transistor 102, a second parasitic capacitor Cgs coupled between the gate and a source of the transistor 102, a third parasitic capacitor Cdb coupled between a well and the drain of the transistor 102, and a fourth parasitic capacitor Csb coupled between the well and the source of the transistor 102.

FIG. 2 is a timing diagram illustrating voltage signals on the prior art RF switch 100 when the RF switch 100 is turned off. In FIG. 2, −VR_DC is a DC (direct current) voltage difference between the source and the drain of the transistor 102, BVdss is source-to-drain breakdown voltage of the transistor 102, Vth is threshold voltage of the transistor 102, Vgs is a voltage difference between the gate and the source of the transistor 102 illustrated by a solid line, and Vgd is a voltage difference between the gate and the drain of the transistor 102 illustrated by a dashed line. Vgs and Vgd are AC signals superimposed on the DC value (−VR_DC), swinging positively or negatively.

FIG. 2 illustrates an ideal condition where capacitance of the first parasitic capacitor Cgd is equal to capacitance of the second parasitic capacitor Cgs when the RF switch 100 is turned off. Thus, impedance between the gate and the source of the transistor 102 is equal to impedance between the gate and the drain of the transistor 102, and voltage amplitude of an RF signal across the source and the drain of the transistor 102 is distributed evenly to Vgs and Vgd. That is, voltage amplitude of Vgs at time point A of FIG. 2 is equal to voltage of Vgd at time point B of FIG. 2. For example, supposing −VR_DC is −3V and voltage amplitude between the source and the drain of the transistor 102 is ±3V, if the voltage amplitude between the source and the drain of the transistor 102 is evenly distributed to Vgs and Vgd, the voltage amplitude of Vgs will be ±1.5V and the voltage amplitude Vgd will also be ±1.5V. Besides, a phase difference of 180 degrees exists between Vgs and Vgd. Thus the voltage of Vgs is −1.5V and the voltage of Vgd is −4.5V at time point A of FIG. 2, and the voltage of Vgs is −4.5V and the voltage of Vgd is −1.5V at time point B of FIG. 2. As long as the voltage amplitudes of both Vgs and Vgd are smaller than Vth or BVdss, the transistor 102 remains turned off.

However, in the real world, the capacitance of the first parasitic capacitor Cgd is related to bias voltage between the gate and the drain of the transistor 102 and the capacitance of the second parasitic capacitor Cgs is related to bias voltage between the gate and the source of the transistor 102. For example, the bias voltage between the gate and the drain of the transistor 102 is −4.5V and the bias voltage between the gate and the source of the transistor 102 is −1.5V at time point A of FIG. 2, thus the capacitance of the first parasitic capacitor Cgd is different from the capacitance of the second parasitic capacitor Cgs. In addition, the distributions of the voltage amplitude of Vgd and Vgs are inversely proportional to the capacitance of the first parasitic capacitor Cgd and the capacitance of the second parasitic capacitor Cgs respectively. As a result, the voltage amplitude between the source and the drain of the transistor 102 is distributed according to a capacitance ratio of Cgd to Cgs, unlike in the ideal condition. If the capacitance ratio of Cgd to Cgs is too big or too small, the voltage amplitude of either Vgs or Vgd may be bigger than Vth or BVdss, which may cause the transistor 102 to turn on falsely.

The third parasitic capacitor Cdb and the fourth parasitic capacitor Csb apply the same aforementioned principles. Under ideal conditions, capacitance of the third parasitic capacitor Cdb is equal to capacitance of the fourth parasitic capacitor Csb of the transistor 102, thus impedance between the well and the source of the transistor 102 is equal to impedance between the well and the drain of the transistor 102, and the voltage amplitude between the source and the drain of the transistor 102 is distributed evenly to Vdb and Vsb, wherein Vdb is a voltage difference between the well and the drain of the transistor 102 and Vsb is a voltage difference between the well and the source of the transistor 102. However, in the real world, the capacitance of the third parasitic capacitor Cdb is different from the capacitance of the fourth parasitic capacitor Csb, thus the voltage amplitude between the source and the drain of the transistor 102 is distributed unevenly to Vdb and Vsb. If the capacitance ratio of Cdb to Csb is too big or too small, Vdb or Vsb may be bigger than Vth or BVdss, the transistor 102 will also be turned on falsely.

SUMMARY OF THE INVENTION

An embodiment of the present invention discloses an RF switch. The RF switch comprises a transistor, a first compensation capacitor, and a second compensation capacitor. The first compensation capacitor is coupled between a control node and a first node of the transistor, and the second compensation capacitor is coupled between the control node and a second node of the transistor. Capacitance of the first compensation capacitor is substantially equal to capacitance of the second compensation capacitor.

Another embodiment of the present invention discloses an RF switch system. The RF switch system comprises a plurality of transistors, a first compensation capacitor, and a second compensation capacitor. The first compensation capacitor is coupled between a control node of a transistor of the plurality of transistors and a first node of the transistor. The second compensation capacitor is coupled between the control node and a second node of the transistor. Capacitance of the first compensation capacitor is substantially equal to capacitance of the second compensation capacitor.

Another embodiment of the present invention discloses an RF switch system. The RF switch system comprises at least one transistors, a first compensation capacitor, and a second compensation capacitor. The first compensation capacitor is coupled between a well and a first node of the at least one transistor. The second compensation capacitor is coupled between the well and a second node of the at least one transistor. Capacitance of the first compensation capacitor is substantially equal to capacitance of the second compensation capacitor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
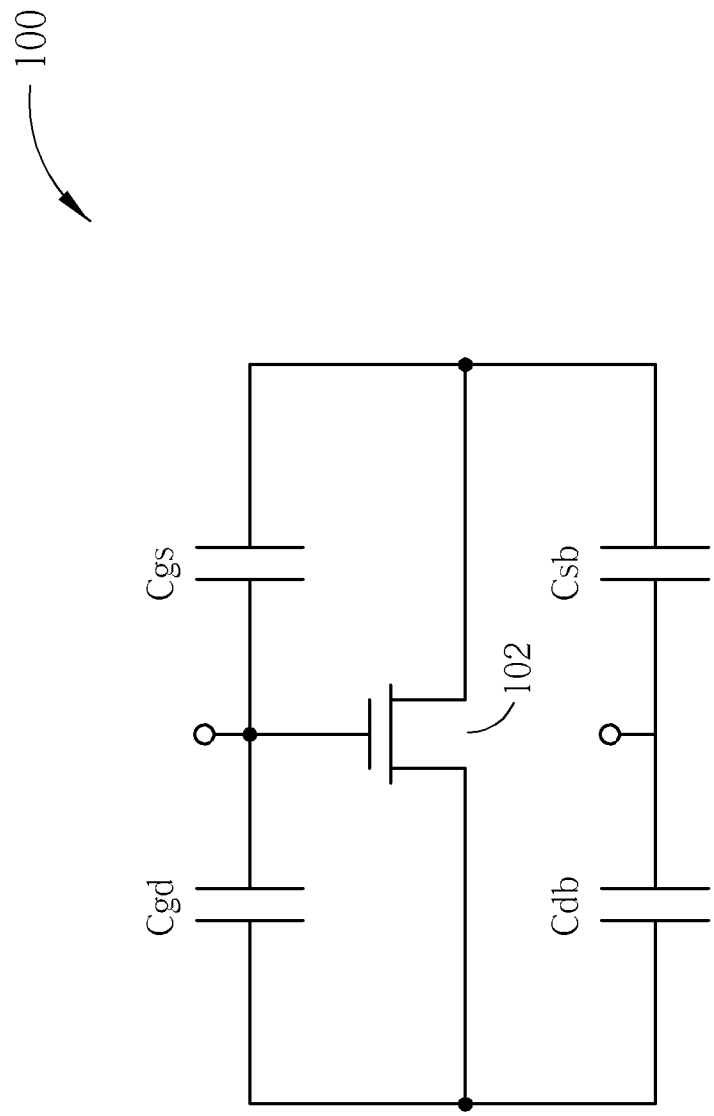
FIG. 1 is a diagram illustrating a prior art RF switch.
Figure 2:
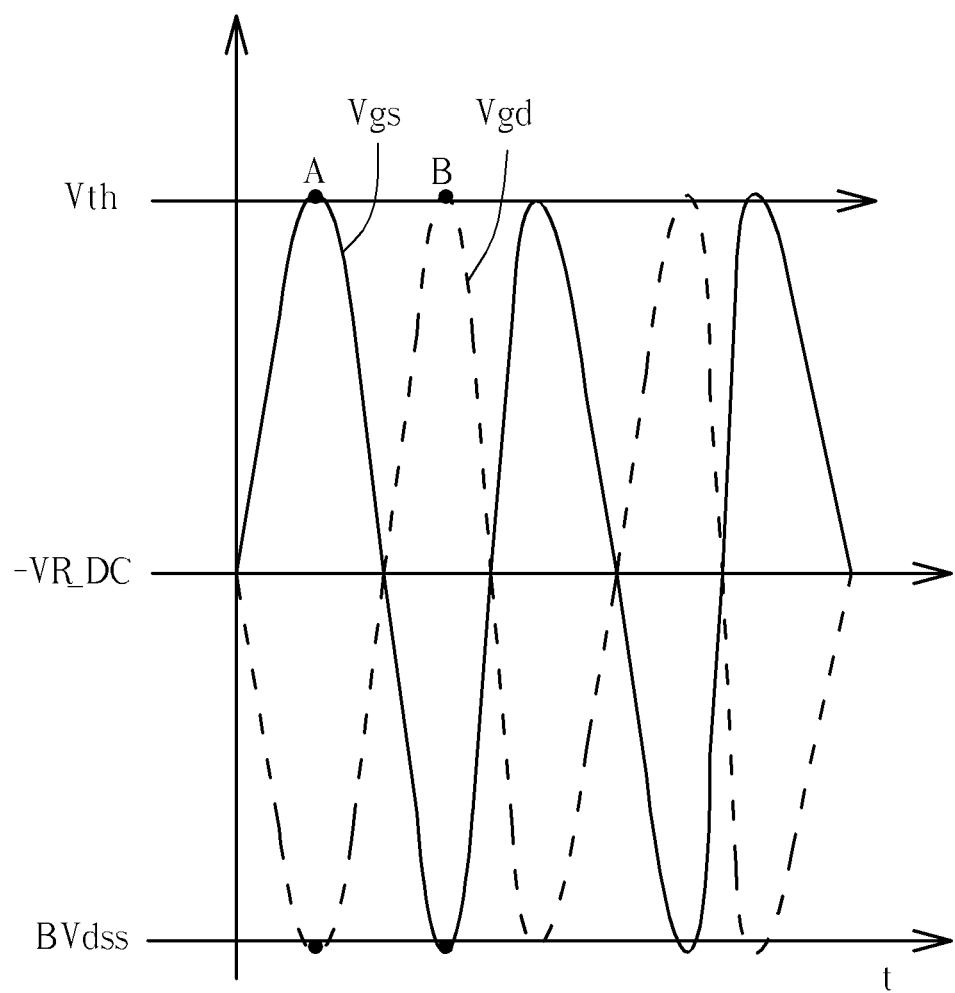
FIG. 2 is a timing diagram illustrating voltage signals on the prior art RF switch when the RF switch is turned off.
Figure 3:
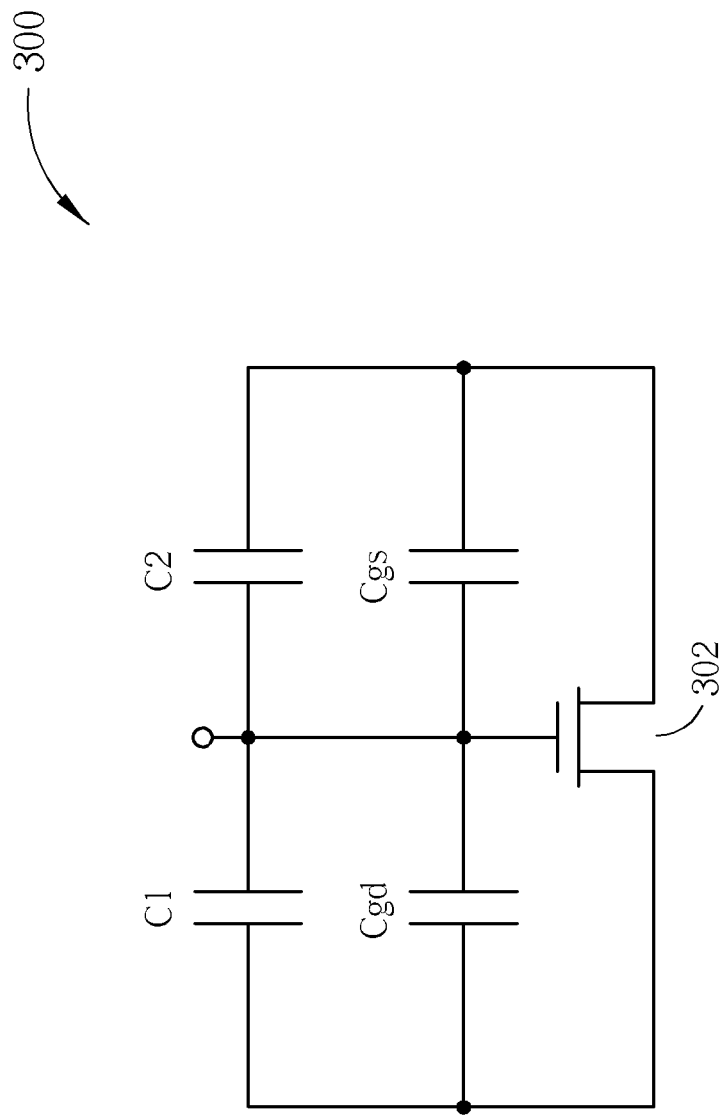
FIG. 3 is a diagram illustrating an RF switch according to a first embodiment of the present invention.

Please refer to FIG. 3 that is a diagram illustrating an RF switch 300 according to a first embodiment of the present invention. The RF switch 300 includes an NMOS (N-type metal-oxide-semiconductor) transistor 302, a first compensation capacitor C1, and a second compensation capacitor C2. The first compensation capacitor C1 is coupled between a gate and a drain of the NMOS transistor 302, and the second compensation capacitor C2 is coupled between the gate and a source of the NMOS transistor 302. Capacitance of the first compensation capacitor C1 is substantially equal to capacitance of the second compensation capacitor C2. The first compensation capacitor C1 and the second compensation capacitor C2 may be MIM (metal-insulator-metal) capacitors suitable for radio frequency usage. Not only a first parasitic capacitor Cgd but also the first compensation capacitor C1 is coupled between the gate and the drain of the NMOS transistor 302, and not only a second parasitic capacitor Cgs but also the second compensation capacitor C2 is coupled between the gate and the source of the NMOS transistor 302.

When the RF switch 300 is turned off, capacitance of the first parasitic capacitor Cgd is different from that of the second parasitic capacitor Cgs. By paralleling the first compensation capacitor C1 to the first parasitic capacitor Cgd and paralleling the second compensation capacitor C2, the capacitance of which is substantially equal to the capacitance of the first compensation capacitor C1, to the second parasitic capacitor Cgs, capacitance of an equivalent capacitor (Cgd+C1) between the gate and the drain of the NMOS transistor 302 and capacitance of an equivalent capacitor (Cgs+C2) between the gate and the source of the NMOS transistor 302 can be adjusted to predetermined ranges respectively so as to better distribute voltage amplitude between the drain and the source to Vgd and Vgs and keep voltage amplitudes of both Vgs and Vgd smaller than Vth or BVdss, in order that the NMOS transistor 302 remains turned off for ensuring that the RF switch 300 is in an off state.

For example, supposing the capacitance of the first parasitic capacitor Cgd is 0.5 pF, the capacitance of the second parasitic capacitor Cgs is 0.1 pF, and a capacitance ratio of Cgd to Cgs is 0.5 pF/0.1 pF =5:1. Thus a voltage amplitude ratio of Vgd to Vgs is 1:5. If the first compensation capacitor C1 and the second compensation capacitor C2 both having the capacitance of 0.1 pF are respectively coupled in parallel to the first parasitic capacitor Cgd and the second parasitic capacitor Cgs, the capacitance ratio of the equivalent capacitor between the gate and the drain of the NMOS transistor 302 to the equivalent capacitor between the gate and the source of the NMOS transistor 302 becomes (0.5+0.1) pF/(0.1+0.1) pF=3:1, thus the voltage amplitude ratio of Vgd to Vgs becomes 1:3, which is smaller than 1:5. In so doing, it is easier to adjust the voltage amplitudes of Vgd and Vgs to be within predetermined ranges respectively, thereby preventing the NMOS transistor 302 from being turned on falsely.

Figure 4A:
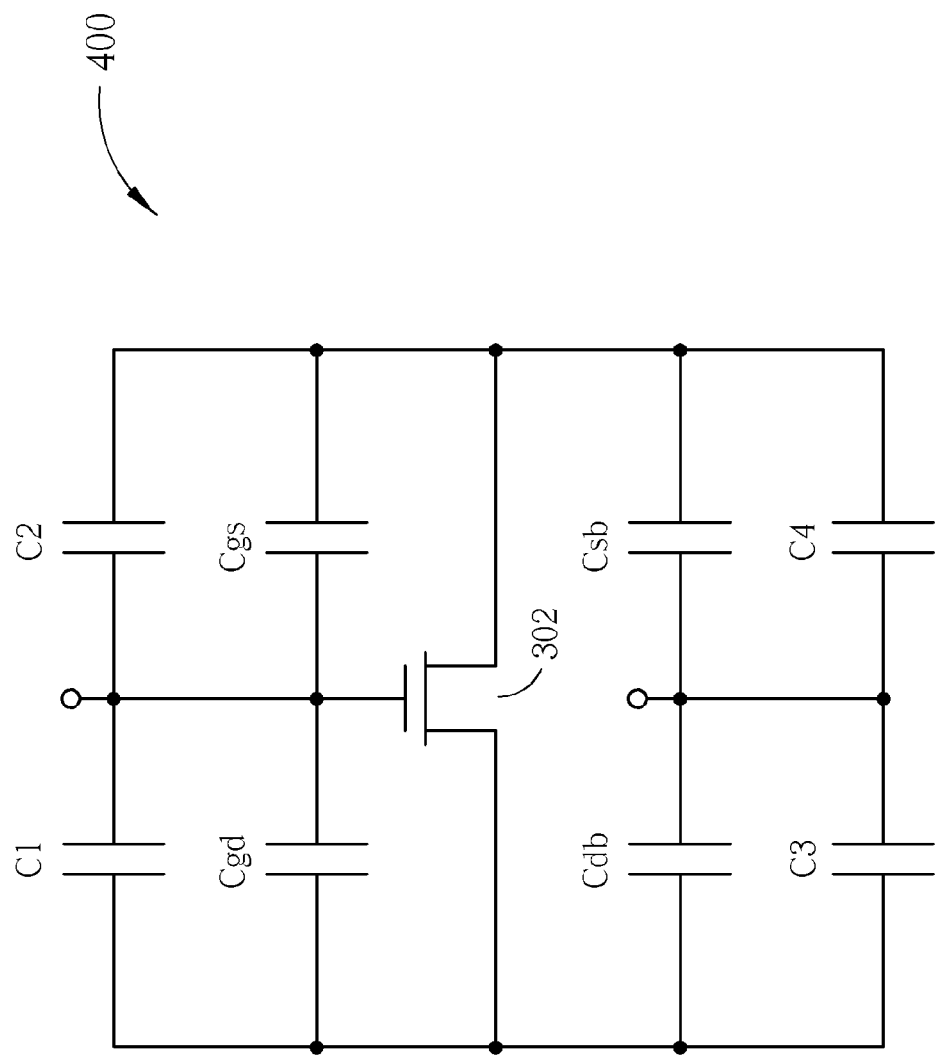
FIG. 4A and FIG. 4B are diagrams illustrating an RF switch according to a second embodiment of the present invention.
Figure 4B:
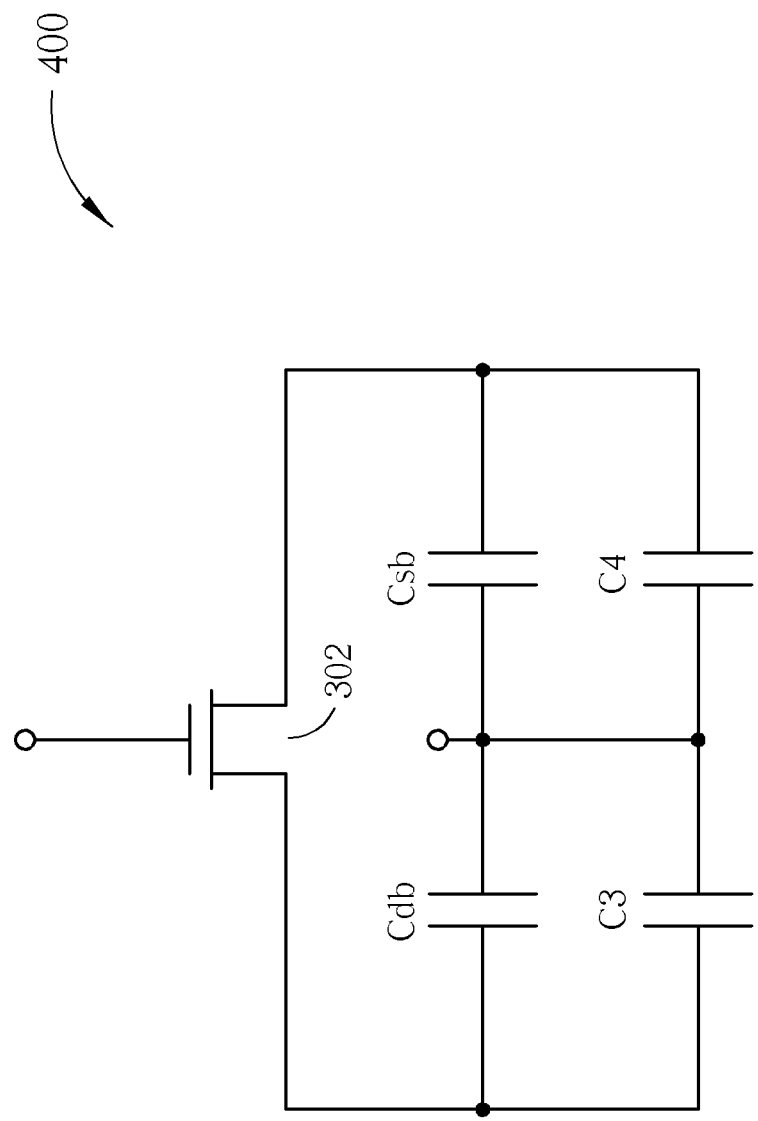

Please refer to FIG. 4A and FIG. 4B. FIG. 4A and FIG. 4B are diagrams illustrating an RF switch 400 according to a second embodiment of the present invention. The RF switch 400 further includes a third compensation capacitor C3, and a fourth compensation capacitor C4. The third compensation capacitor C3 is coupled between a well and the drain of the NMOS transistor 302, and the fourth compensation capacitor C4 is coupled between the well and the source of the NMOS transistor 302. Capacitance of the third compensation capacitor C3 is substantially equal to capacitance of the fourth compensation capacitor C4. The third compensation capacitor C3 and the fourth compensation capacitor C4 may be MIM capacitors suitable for radio frequency usage. Besides, a third parasitic capacitor Cdb exists between the well and the drain of the NMOS transistor 302 and a fourth parasitic capacitor Csb exists between the well and the source of the NMOS transistor 302. Thus, not only the third parasitic capacitor Cdb but also the third compensation capacitor C3 is coupled between the well and the drain of the NMOS transistor 302, and not only the fourth parasitic capacitor Csb but also the fourth compensation capacitor C4 is coupled between the well and the source of the NMOS transistor 302.

When the RF switch 400 is turned off, capacitance of the third parasitic capacitor Cdb is different from that of the fourth parasitic capacitor Csb. By paralleling the third compensation capacitor C3 to the third parasitic capacitor Cdb and paralleling the fourth compensation capacitor C4, the capacitance of which is substantially equal to the capacitance the third compensation capacitor C3, to the fourth parasitic capacitor Csb, capacitance of an equivalent capacitor (Cdb+C3) between the well and the drain of the NMOS transistor 302 and capacitance of an equivalent capacitor (Csb+C4) between the well and the source of the NMOS transistor 302 can be adjusted to predetermined ranges respectively so as to better distribute the voltage amplitude between the drain and the source to Vdb and Vsb and keep the voltage amplitudes of both Vsb and Vdb smaller than Vth or BVdss, in order that the NMOS transistor 302 remains turned off for ensuring that the RF switch 400 is in an off state.

For example, supposing the capacitance of the third parasitic capacitor Cdb is 0.5 pF, the capacitance of the fourth parasitic capacitor Cgs is 0.1 pF, and a capacitance ratio of Cdb to Csb is 0.5 pF/0.1 pF =5:1. Thus the voltage amplitude ratio of Vdb to Vsb is 1:5. If the third compensation capacitor C3 and the fourth compensation capacitor C4 both having the capacitance of 0.1 pF are respectively coupled in parallel to the third parasitic capacitor Cdb and the fourth parasitic capacitor Csb, the capacitance ratio of the equivalent capacitor between the well and the drain of the NMOS transistor 302 to the equivalent capacitor between the well and the source of the NMOS transistor 302 becomes (0.5+0.1) pF/(0.1+0.1) pF=3:1, thus the voltage amplitude ratio of Vdb to Vsb becomes 1:3, which is smaller than 1:5. In so doing, it is easier to adjust the voltage amplitudes of Vdb and Vsb to be within predetermined ranges respectively, thereby preventing the NMOS transistor 302 from being turned on falsely.

In the aforementioned second embodiment, the first compensation capacitor C1, the second compensation capacitor C2, the third compensation capacitor C3, and the fourth compensation capacitor C4 may all be coupled to the NMOS transistor 302 in order to better adjust the voltage amplitudes of Vgd, Vgs, Vdb, and Vsb. Or, as shown in FIG. 4B, only the third compensation capacitor C3 and the fourth compensation capacitor C4 may be coupled to the NMOS transistor 302 in order to better adjust the voltage amplitudes of Vdb and Vsb, thereby keeping the voltage amplitudes of both Vsb and Vdb smaller than Vth or BVdss, so that the NMOS transistor 302 remains turned off for ensuring that the RF switch 400 is in an off state.

Figure 5:
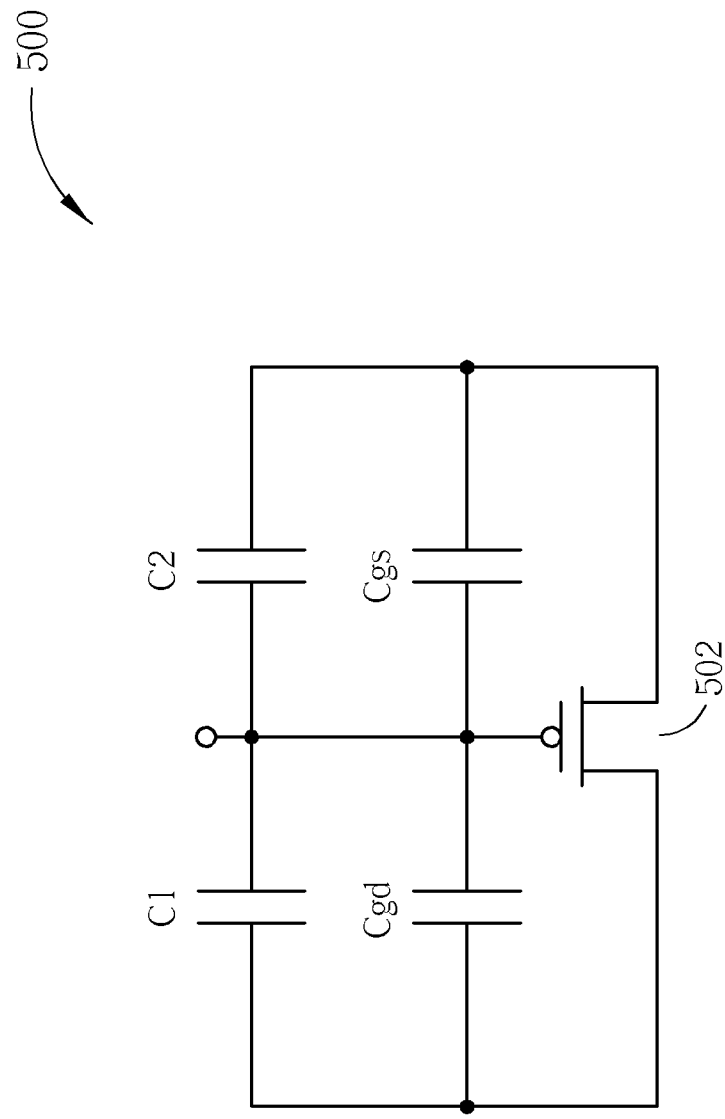
FIG. 5 is a diagram illustrating an RF switch according to a third embodiment of the present invention.

Please refer to FIG. 5 that is a diagram illustrating an RF switch 500 according to a third embodiment of the present invention. The RF switch 500 includes a PMOS (P-type metal-oxide-semiconductor) transistor 502, a first compensation capacitor C1, and a second compensation capacitor C2. The first compensation capacitor C1 is coupled between a gate and a drain of the PMOS transistor 502, and the second compensation capacitor C1 is coupled between the gate and a source of the PMOS transistor 502. Capacitance of the first compensation capacitor C1 is substantially equal to capacitance of the second compensation capacitor C2. The first compensation capacitor C1 and the second compensation capacitor C1 may be MIM capacitors suitable for radio frequency usage. Not only a first parasitic capacitor Cgd but also the first compensation capacitor C1 is coupled between the gate and the drain of the PMOS transistor 502, and not only a second parasitic capacitor Cgs but also the second compensation capacitor C1 is coupled between the gate and the source of the PMOS transistor 502.

When the RF switch 500 is turned off, capacitance of the first parasitic capacitor Cgd is different from that of the second parasitic capacitor Cgs. By paralleling the first compensation capacitor C1 to the first parasitic capacitor Cgd and paralleling the second compensation capacitor C2, the capacitance of which is substantially equal to the capacitance the first compensation capacitor C1, to the second parasitic capacitor Cgs, capacitance of an equivalent capacitor (Cgd+C1) between the gate and the drain of the PMOS transistor 502 and capacitance of an equivalent capacitor (Cgs+C2) between the gate and the source of the PMOS transistor 502 can be adjusted to predetermined ranges respectively so as to better distribute voltage amplitude between the drain and the source to Vgd and Vgs and keep the voltage amplitudes of both Vgs and Vgd smaller than Vth or BVdss, in order that the PMOS transistor 502 remains turned off for ensuring that the RF switch 500 is in an off state.

Figure 6A:
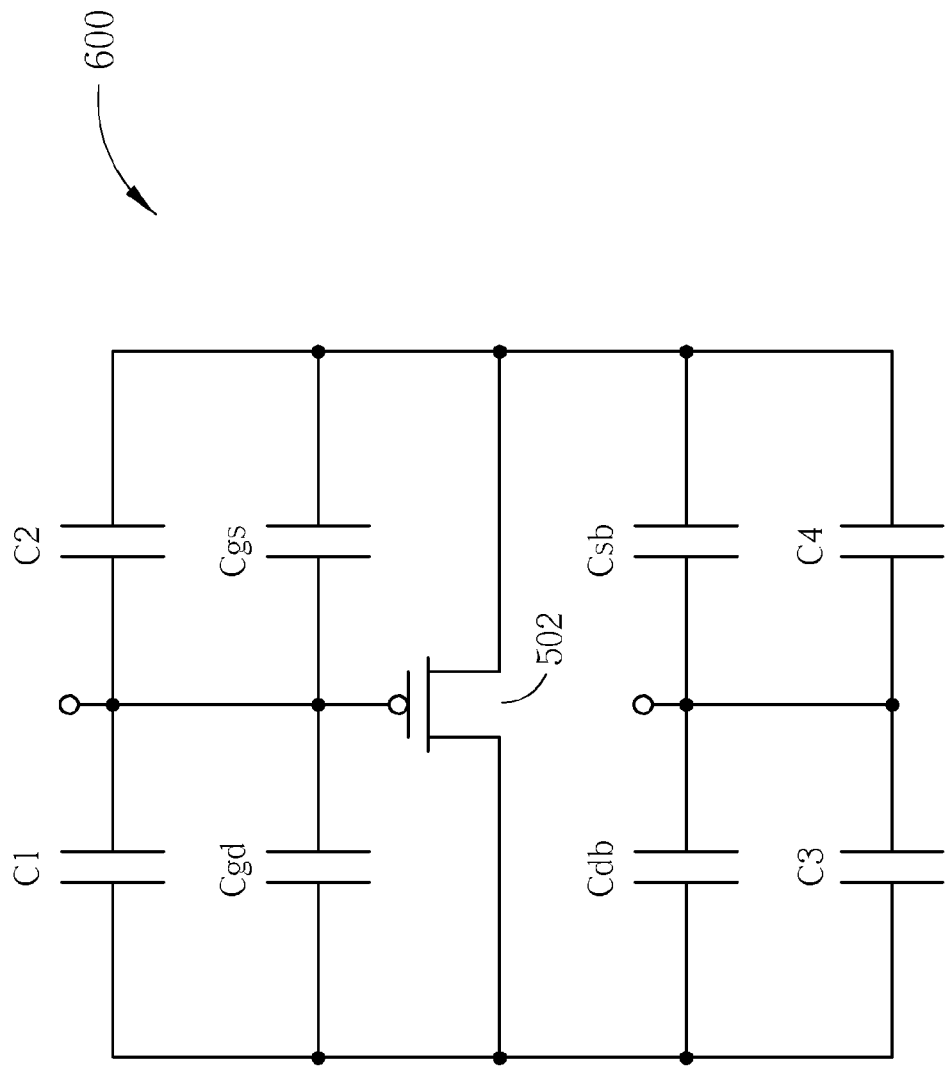
FIG. 6A and FIG. 6B are diagrams illustrating an RF switch according to a fourth embodiment of the present invention.
Figure 6B:
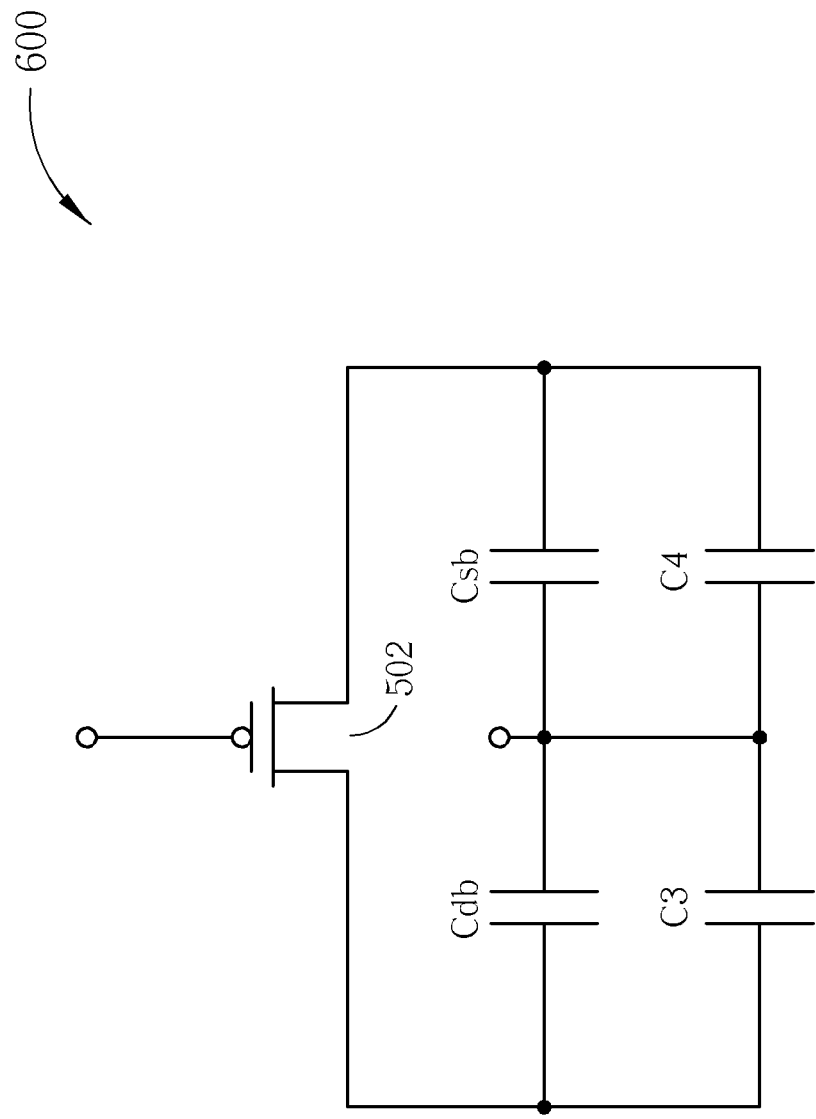

Please refer to FIG. 6A and FIG. 6B. FIG. 6A and FIG. 6B are diagrams illustrating an RF switch 600 according to a fourth embodiment of the present invention. The RF switch 600 further includes a third compensation capacitor C3, and a fourth compensation capacitor C4. The third compensation capacitor C3 is coupled between a well and the drain of the PMOS transistor 502, and the fourth compensation capacitor C4 is coupled between the well and the source of the PMOS transistor 502. Capacitance of the third compensation capacitor C3 is substantially equal to capacitance of the fourth compensation capacitor C4. The third compensation capacitor C3 and the fourth compensation capacitor C4 may be MIM capacitors suitable for radio frequency usage. Besides, a third parasitic capacitor Cdb exists between the well and the drain of the PMOS transistor 502 and a fourth parasitic capacitor Csb exists between the well and the source of the PMOS transistor 502. Thus, not only the third parasitic capacitor Cdb but also the third compensation capacitor C3 is coupled between the well and the drain of the PMOS transistor 502, and not only the fourth parasitic capacitor Csb but also the fourth compensation capacitor C4 is coupled between the well and the source of the PMOS transistor 502.

When the RF switch 600 is turned off, capacitance of the third parasitic capacitor Cdb is different from that of the fourth parasitic capacitor Csb. By paralleling the third compensation capacitor C3 to the third parasitic capacitor Cdb and paralleling the fourth compensation capacitor C4, the capacitance of which is substantially equal to the capacitance the third compensation capacitor C3, to the fourth parasitic capacitor Csb, capacitance of an equivalent capacitor (Cdb+C3) between the well and the drain of the PMOS transistor 502 and capacitance of an equivalent capacitor (Csb+C4) between the well and the source of the PMOS transistor 502 can be adjusted to predetermined ranges respectively so as to better distribute the voltage amplitude between the drain and the source to Vdb and Vsb and keep the voltage amplitudes of both Vsb and Vdb smaller than Vth or BVdss, in order that the PMOS transistor 502 remains turned off for ensuring that the RF switch 600 is in an off state.

In the aforementioned fourth embodiment, the first compensation capacitor C1, the second compensation capacitor C2, the third compensation capacitor C3, and the fourth compensation capacitor C4 may all be coupled to the PMOS transistor 502 in order to better adjust the voltage amplitudes of Vgd, Vgs, Vdb, and Vsb. Or, as shown in FIG. 6B, only the third compensation capacitor C3 and the fourth compensation capacitor C4 may be coupled to the PMOS transistor 502 in order to better adjust the voltage amplitudes of Vdb and Vsb, thereby keeping the voltage amplitudes of both Vsb and Vdb smaller than Vth or BVdss, so that the PMOS transistor 502 remains turned off for ensuring that the RF switch 600 is in an off state.

Figure 7:
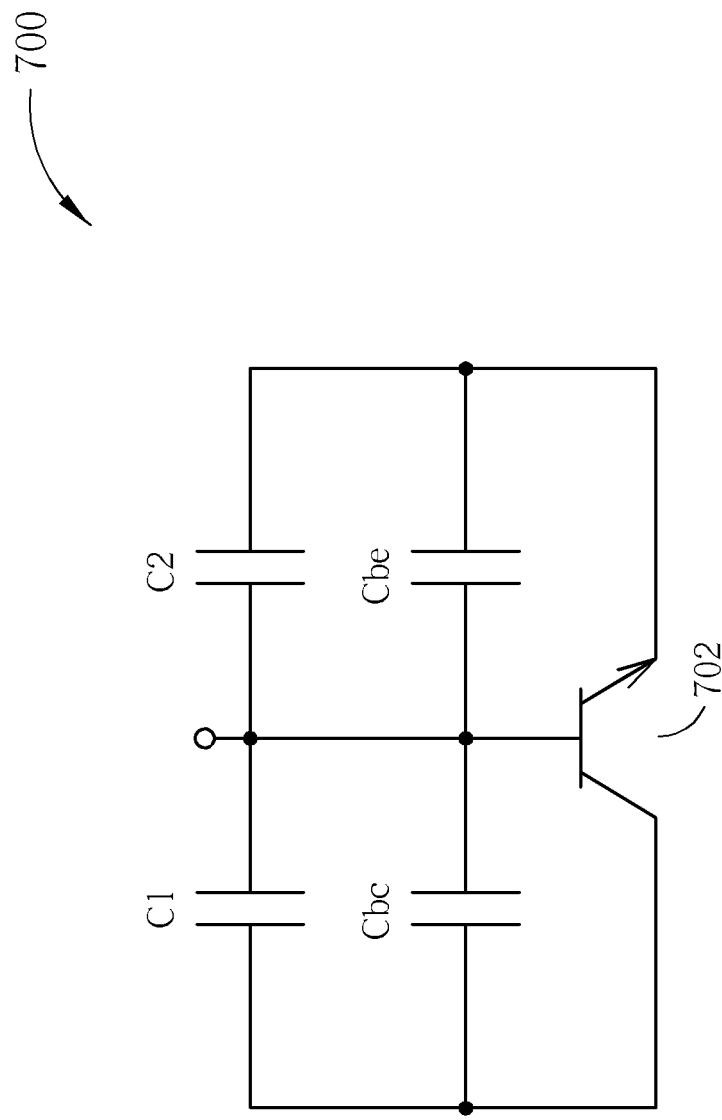
FIG. 7 is a diagram illustrating an RF switch according to a fifth embodiment of the present invention.

Please refer to FIG. 7 that is a diagram illustrating an RF switch 700 according to a fifth embodiment of the present invention. The RF switch 700 includes an NPN (N-type P-type N-type) BJT (bipolar junction transistor) 702, a first compensation capacitor C1, and a second compensation capacitor C2. The first compensation capacitor C1 is coupled between a base and a collector of the BJT 702, and the second compensation capacitor C1 is coupled between the base and an emitter of the BJT 702. Capacitance of the first compensation capacitor C1 is substantially equal to capacitance of the second compensation capacitor C2. The first compensation capacitor C1 and the second compensation capacitor C1 may be MIM capacitors suitable for radio frequency usage. Not only a first parasitic capacitor Cbc but also the first compensation capacitor C1 is coupled between the base and the collector of the BJT 702, and not only a second parasitic capacitor Cbe but also the second compensation capacitor C1 is coupled between the base and the emitter of the BJT 702.

When the RF switch 700 is turned off, capacitance of the first parasitic capacitor Cbc is different from that of the second parasitic capacitor Cbe. By paralleling the first compensation capacitor C1 to the first parasitic capacitor Cbc and paralleling the second compensation capacitor C2, the capacitance of which is substantially equal to the capacitance the first compensation capacitor C1, to the second parasitic capacitor Cbe, capacitance of an equivalent capacitor (Cbc+C1) between the base and the collector of the BJT 702 and capacitance of an equivalent capacitor (Cbe+C2) between the base and the emitter of the BJT 702 can be adjusted to predetermined ranges respectively so as to better distribute voltage amplitude between the collector and the emitter to Vbc and Vbe, where Vbc is a voltage difference between the base and the collector of the BJT 702 and Vbe is a voltage difference between the base and the emitter of the BJT 702, and keep the voltage amplitudes of both Vbc and Vbe within predetermined voltage amplitude ranges respectively, in order that the BJT 702 remains turned off for ensuring that the RF switch 700 is in an off state.

Figure 8:
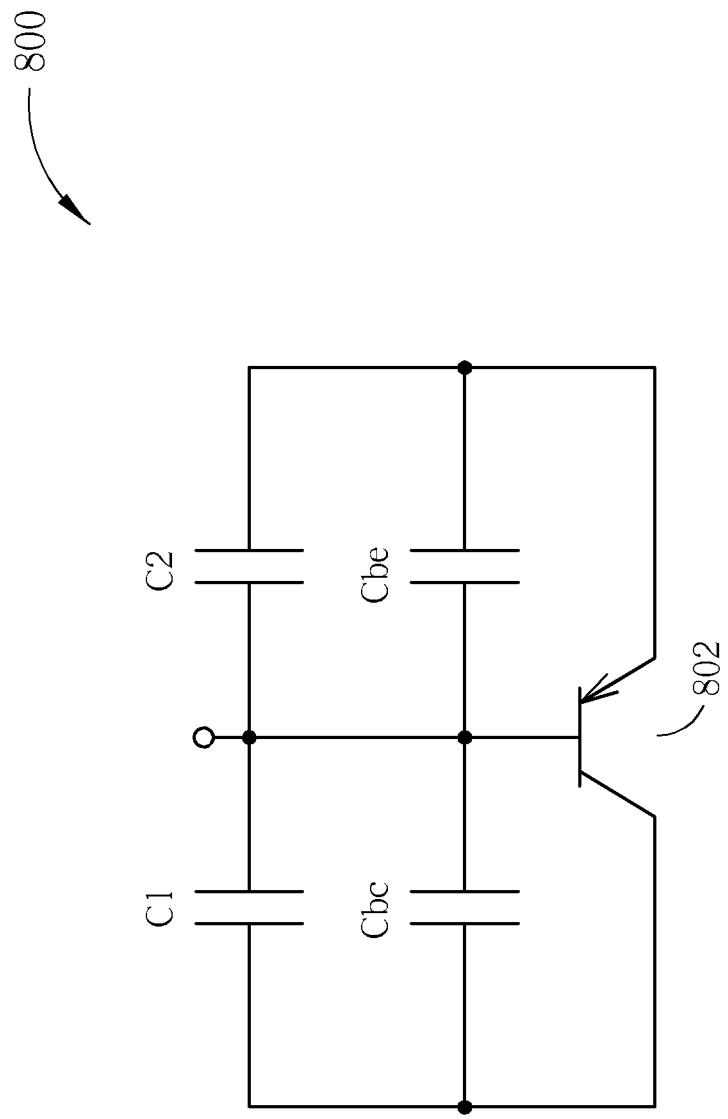
FIG. 8 is a diagram illustrating an RF switch according to a sixth embodiment of the present invention.

Please refer to FIG. 8 that is a diagram illustrating an RF switch 800 according to a sixth embodiment of the present invention. The RF switch 800 includes a PNP (P-type N-type P-type) BJT (bipolar junction transistor) 802, a first compensation capacitor C1, and a second compensation capacitor C2. The first compensation capacitor C1 is coupled between a base and a collector of the BJT 802, and the second compensation capacitor C1 is coupled between the base and an emitter of the BJT 802. Capacitance of the first compensation capacitor C1 is substantially equal to capacitance of the second compensation capacitor C2. The first compensation capacitor C1 and the second compensation capacitor C1 may be MIM capacitors suitable for radio frequency usage. Not only a first parasitic capacitor Cbc but also the first compensation capacitor C1 is coupled between the base and the collector of the BJT 802, and not only a second parasitic capacitor Cbe but also the second compensation capacitor C1 is coupled between the base and the emitter of the BJT 802.

When the RF switch 800 is turned off, capacitance of the first parasitic capacitor Cbc is different from that of the second parasitic capacitor Cbe. By paralleling the first compensation capacitor C1 to the first parasitic capacitor Cbc and paralleling the second compensation capacitor C2, the capacitance of which is substantially equal to the capacitance the first compensation capacitor C1, to the second parasitic capacitor Cbe, capacitance of an equivalent capacitor (Cbc+C1) between the base and the collector of the BJT 802 and capacitance of an equivalent capacitor (Cbe+C2) between the base and the emitter of the BJT 802 can be adjusted to predetermined ranges respectively so as to better distribute voltage amplitude between the collector and the emitter to Vbc and Vbe, where Vbc is a voltage difference between the base and the collector of the BJT 802 and Vbe is a voltage difference between the base and the emitter of the BJT 802, and keep the voltage amplitudes of both Vbc and Vbe within predetermined voltage amplitude ranges respectively, in order that the BJT 802 remains turned off for ensuring that the RF switch 800 is in an off state.

Figure 9:
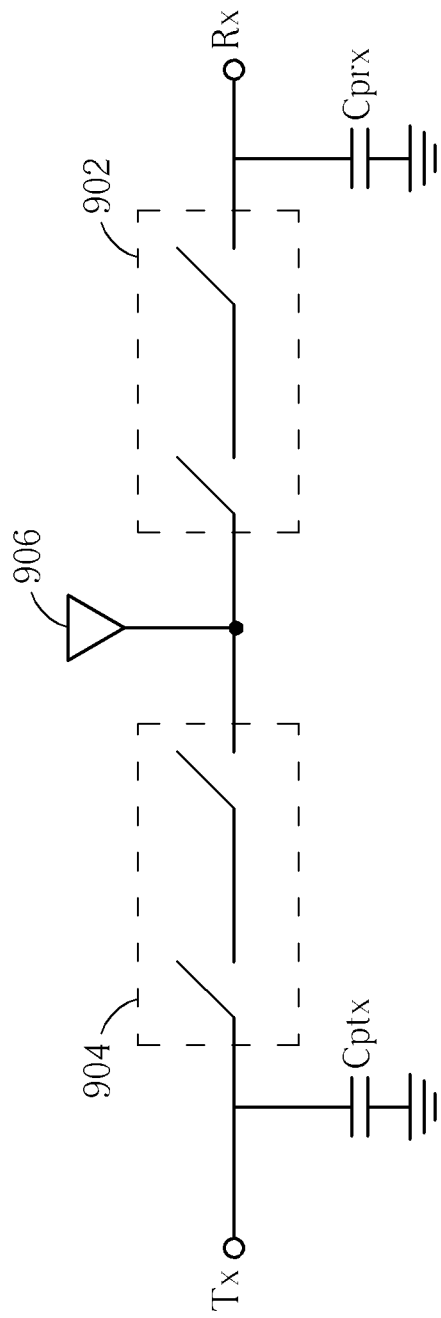
FIG. 9 is a diagram illustrating an RF device according to an embodiment of the present invention.

Please refer to FIG. 9 that is a diagram illustrating an RF device 900. The RF switch device includes two RF switch systems 902 and 904 and an RF antenna 906. When the RF device 900 is receiving signals, the RF switch system 902, containing a first set of serial connected RF switches, coupled between the RF antenna 906 and a receiving end Rx is turned on for receiving the signals, whereas the RF switch system 904, containing a second set of serial connected RF switches, coupled between the RF antenna 906 and a transmitting end Tx is turned off for stopping transmitting signals.

In FIG. 9, the first set and the second set of serial connected RF switches of the RF switch system 902 and 904 may be any combination of RF switches selected from the RF switches 300, 400, 500, 600, 700, 800 in the aforementioned embodiments. Utilizing the RF switches 300, 400, 500, 600, 700, 800 in the RF switch system 902 and 904 not only improves the capacitance ratio of the equivalent capacitors and the voltage amplitude distribution of each RF switch but also improves capacitance ratio of equivalent capacitors and the voltage amplitude distribution among the serial connected RF switches. Due to the voltage amplitude distributed to each RF switch in the RF switch system 902 being related to a capacitance ratio of a parasitic capacitor Cprx between the receiving end Rx and a ground to the equivalent capacitors of each RF switch, and the voltage amplitude distributed to each RF switch in the RF switch system 904 is related to a capacitance ratio of a parasitic capacitor Cptx between the transmitting end Tx and the ground to the equivalent capacitors of each RF switch, connecting the compensation capacitors to each RF switch as in aforementioned embodiments may increase the equivalent capacitors of each RF switch for decreasing the capacitance ratio of the parasitic capacitor Cprx to the equivalent capacitors of the RF switch and the capacitance ratio of the parasitic capacitor Cptx to the equivalent capacitors of the RF switch such that the voltage amplitude of the RF switch system 902 or 904 is more evenly distributed to each RF switch for ensuring that each RF switch and the RF switch systems are in an off state.

To sum up, adjusting the capacitance of equivalent capacitors by paralleling the compensation capacitors to the RF switch can improve the voltage amplitude distribution of the RF switch and further improve the voltage amplitude distribution of the RF switch system, so as to ensure that the RF switch remains turned off and preventing the RF switch from being turned on falsely, and thereby increasing design efficiency and accuracy.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An RF (radio frequency) switch comprising:
   a transistor having a first node, a second node, and a control node;
   a first compensation capacitor coupled between the control node and the first node of the transistor;
   a second compensation capacitor coupled between the control node and the second node of the transistor;
   a third compensation capacitor coupled between a well and the first node of the transistor; and
   a fourth compensation capacitor coupled between the well and the second node of the transistor;
   wherein a capacitance of the first compensation capacitor is substantially equal to a capacitance of the second compensation capacitor, and a capacitance of the third compensation capacitor is substantially equal to a capacitance of the fourth compensation capacitor.

2. The RF switch of claim 1 wherein the transistor is an NMOS (N-type metal-oxide-semiconductor) transistor, the control node is a gate of the NMOS transistor, the first node is a drain of the NMOS transistor, and the second node is a source of the NMOS transistor.

3. The RF switch of claim 1, wherein the third compensation capacitor and the fourth compensation capacitor are MIM (metal-insulator-metal) capacitors.

4. The RF switch of claim 1 wherein the transistor is a PMOS (P-type metal-oxide-semiconductor) transistor, the control node is a gate of the PMOS transistor, the first node is a drain of the PMOS transistor, and the second node is a source of the PMOS transistor.

5. The RF switch of claim 1, wherein a first parasitic capacitor exists between the control node and the first node of the transistor and connected in parallel with the first compensation capacitor, a second parasitic capacitor exists between the control node and the second node of the transistor and connected in parallel with the second compensation capacitor, a third parasitic capacitor exists between the well and the first node of the transistor and connected in parallel with the third compensation capacitor, a fourth parasitic capacitor exists between the well and the second node of the transistor and connected in parallel with the fourth compensation capacitor, the capacitance of the first compensation capacitor and the capacitance of the second compensation capacitor are between values of a capacitance of the first parasitic capacitor and a capacitance of the second parasitic capacitor, inclusively, and the capacitance of the third compensation capacitor and the capacitance of the fourth compensation capacitor are between values of a capacitance of the third parasitic capacitor and a capacitance of the fourth parasitic capacitor, inclusively.

6. The RF switch of claim 1 wherein the transistor is a BJT (bipolar junction transistor), the control node is a base of the BJT, the first node is a collector of the BJT, and the second node is an emitter of the BJT.

7. The RF switch of claim 6 wherein the BJT is a PNP (P-type N-type P-type) BJT.

8. The RF switch of claim 6 wherein the BJT is an NPN (N-type P-type N-type) BJT.

9. The RF switch of claim 1 wherein the first compensation capacitor and the second compensation capacitor are MIM (metal-insulator-metal) capacitors.

10. An RF switch comprising:
a transistor having a first node, a second node, and a control node;
a first compensation capacitor coupled between the control node and the first node of the transistor; and
a second compensation capacitor coupled between the control node and the second node of the transistor;
wherein a first parasitic capacitor exists between the control node and the first node of the transistor and connected in parallel with the first compensation capacitor, a second parasitic capacitor exists between the control node and the second node of the transistor and connected in parallel with the second compensation capacitor, a capacitance of the first compensation capacitor is substantially equal to a capacitance of the second compensation capacitor, and the capacitance of the first compensation capacitor and the capacitance of the second compensation capacitor are between values of a capacitance of the first parasitic capacitor and a capacitance of the second parasitic capacitor, inclusively.

11. The RF switch of claim 10 wherein the transistor is an NMOS (N-type metal-oxide-semiconductor) transistor, the control node is a gate of the NMOS transistor, the first node is a drain of the NMOS transistor, and the second node is a source of the NMOS transistor.

12. The RF switch of claim 11 further comprising:
a third compensation capacitor coupled between a P-well and the drain of the NMOS transistor; and
a fourth compensation capacitor coupled between the P-well and the source of the NMOS transistor.

13. The RF switch of claim 12, wherein a capacitance of the third compensation capacitor is substantially equal to a capacitance of the fourth compensation capacitor.

14. The RF switch of claim 12, wherein the third compensation capacitor and the fourth compensation capacitor are MIM (metal-insulator-metal) capacitors.

15. The RF switch of claim 10 wherein the transistor is a PMOS (P-type metal-oxide-semiconductor) transistor, the control node is a gate of the PMOS transistor, the first node is a drain of the PMOS transistor, and the second node is a source of the PMOS transistor.

16. The RF switch of claim 15 further comprising:
a third compensation capacitor coupled between an N-well and the drain of the PMOS transistor; and
a fourth compensation capacitor coupled between the N-well and the source of the PMOS transistor.

17. The RF switch of claim 16, wherein a capacitance of the third compensation capacitor is substantially equal to a capacitance of the fourth compensation capacitor.

18. The RF switch of claim 16, wherein the third compensation capacitor and the fourth compensation capacitor are MIM (metal-insulator-metal) capacitors.

19. The RF switch of claim 10 wherein the transistor is a BJT (bipolar junction transistor), the control node is a base of the BJT, the first node is a collector of the BJT, and the second node is an emitter of the BJT.

20. The RF switch of claim 19 wherein the BJT is a PNP (P-type N-type P-type) BJT.

21. The RF switch of claim 19 wherein the BJT is an NPN (N-type P-type N-type) BJT.

22. The RF switch of claim 10 wherein the first compensation capacitor and the second compensation capacitor are MIM (metal-insulator-metal) capacitors.

23. An RF switch comprising:
a transistor having a first node, a second node, and a control node;
a first compensation capacitor coupled between a well and the first node of the transistor;
a second compensation capacitor coupled between the well and the second node of the transistor;
wherein a capacitance of the first compensation capacitor is substantially equal to a capacitance of the second compensation capacitor, a first parasitic capacitor exists between the well and the first node of the transistor and connected in parallel with the first compensation capacitor, a second parasitic capacitor exists between the well and the second node of the transistor and connected in parallel with the second compensation capacitor, and the capacitance of the first compensation capacitor and the capacitance of the second compensation capacitor are between values of a capacitance of the first parasitic capacitor and a capacitance of the second parasitic capacitor, inclusively.

* * * * *